US006777988B2

(12) United States Patent
Tung et al.

(10) Patent No.: US 6,777,988 B2
(45) Date of Patent: Aug. 17, 2004

(54) 2-LEVEL SERIES-GATED CURRENT MODE LOGIC WITH INDUCTIVE COMPONENTS FOR HIGH-SPEED CIRCUITS

(76) Inventors: John C. Tung, 20370 Town Center La., Suite 240, Cupertino, CA (US) 95014; Minghao Zhang, 20370 Town Center La., Suite 240, Cupertino, CA (US) 95014

( * ) Notice: Subject to any disclaimer, the term of this patent is extended or adjusted under 35 U.S.C. 154(b) by 0 days.

(21) Appl. No.: 10/136,165

(22) Filed: Apr. 30, 2002

(65) Prior Publication Data

US 2003/0201815 A1 Oct. 30, 2003

(51) Int. Cl.[7] ................ H03K 21/00; H03K 25/00; H03K 23/00
(52) U.S. Cl. ................ 327/115; 327/117; 327/203; 326/115
(58) Field of Search ................ 327/199, 115, 327/117, 200, 201, 202, 203, 208, 209, 210, 218; 326/115, 127

(56) References Cited

U.S. PATENT DOCUMENTS 6,340,899 B1 * 1/2002 Green ................ 326/115
6,433,595 B1 * 8/2002 Tung et al. ................ 327/115
6,525,571 B2 * 2/2003 Green ................ 326/115
6,559,693 B2 * 5/2003 Tung et al. ................ 327/115

OTHER PUBLICATIONS

US2003/0141919, Wang et al., Jul. 31, 2003 "Active Peaking Usign Differential Pairs of Transistors".*

* cited by examiner

Primary Examiner—Tuan T. Lam
(74) Attorney, Agent, or Firm—Joe Zheng

(57) ABSTRACT

A fundamental building block of 2-level series-gated CML-based CMOS circuit which includes a number of inductive components for an electronic circuit system is disclosed that is capable of driving a significant level of external capacitive load at a high input clock frequency while providing a high level of output signal fidelity for optical data communication. The inductive components can be implemented as either separate inductors or as differentially coupled pairs forming a corresponding transformer element. The value of any particular inductive component is first selected to approximately resonate, at the desired output signal frequency, with its associated equivalent node capacitance but further adjusted to a final value that results in a minimum output waveform distortion for the particular application. Two exemplary cases of application, a Divide-by-2 counter and a Master Slave D-type Flip Flop are presented with associated time domain output waveforms.

14 Claims, 15 Drawing Sheets

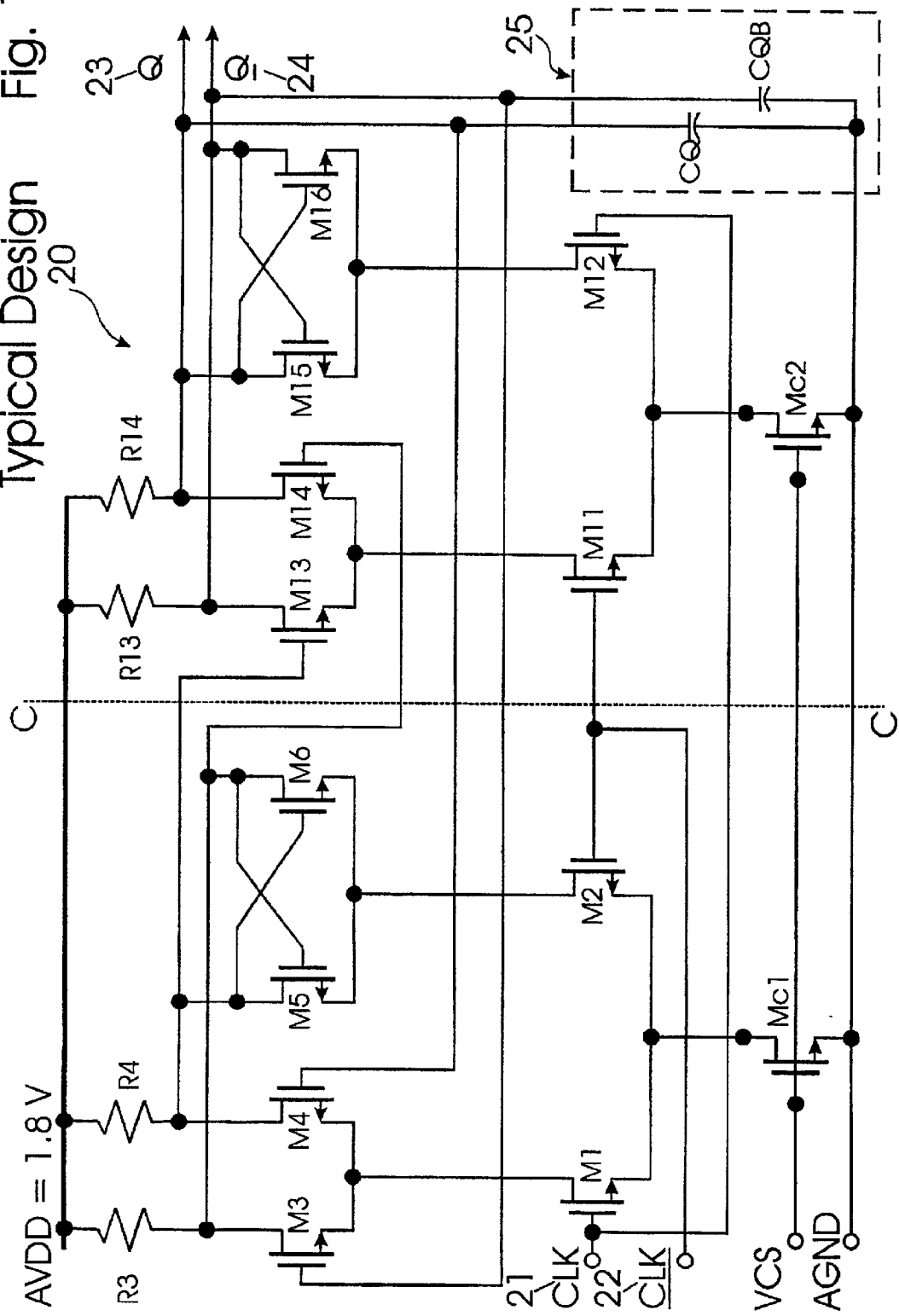

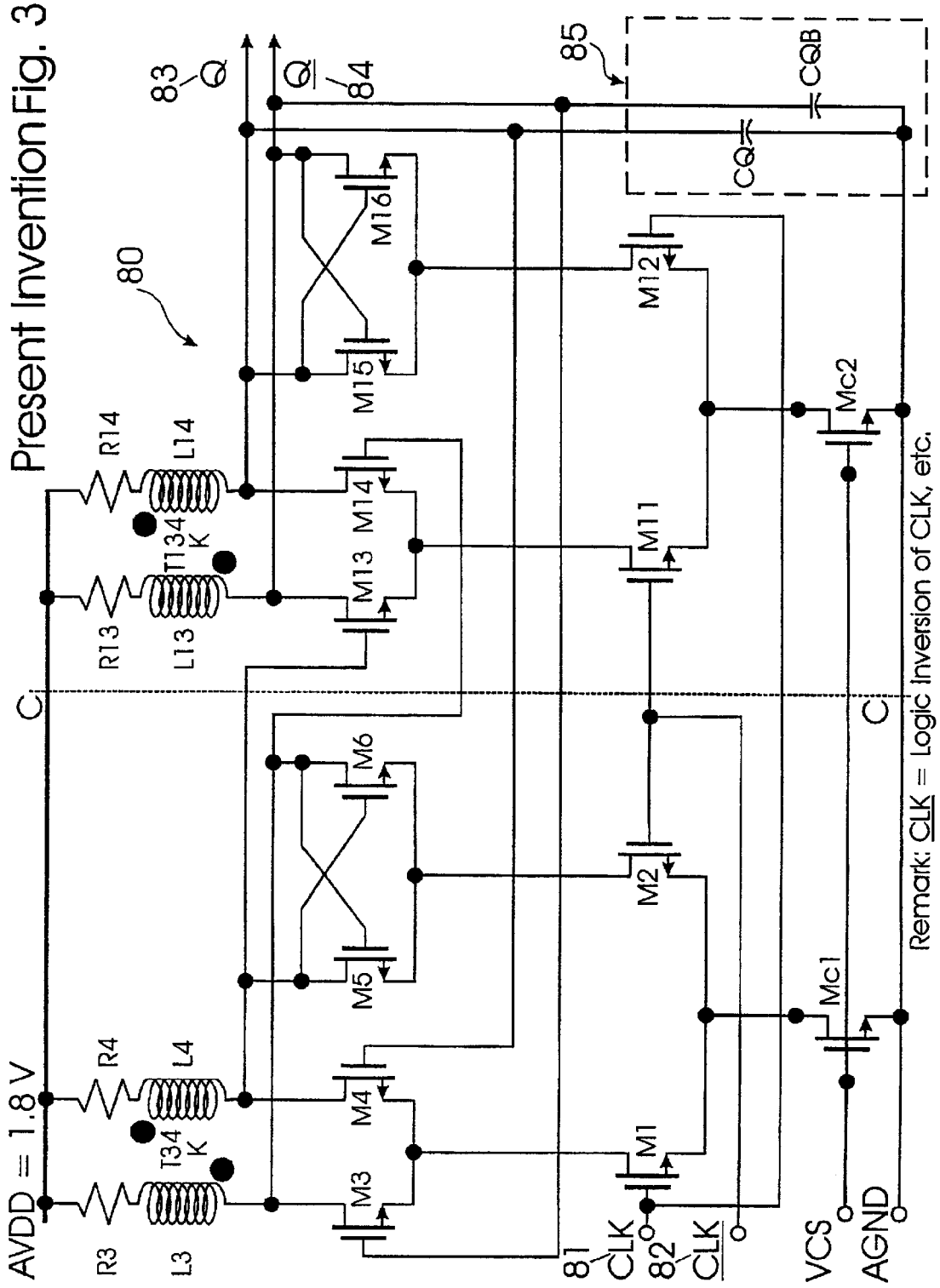
Present Invention Fig. 3

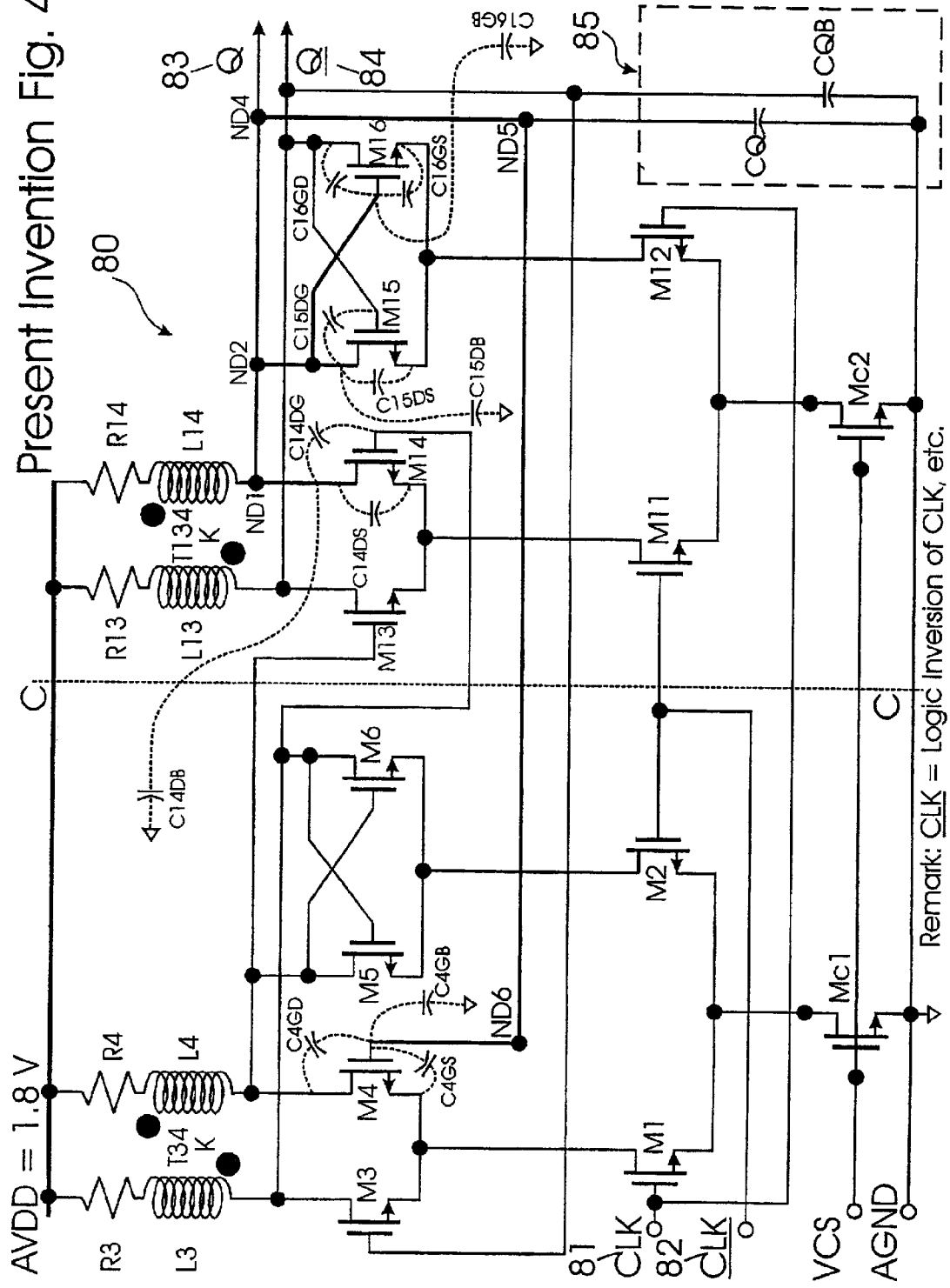
Present Invention Fig. 4

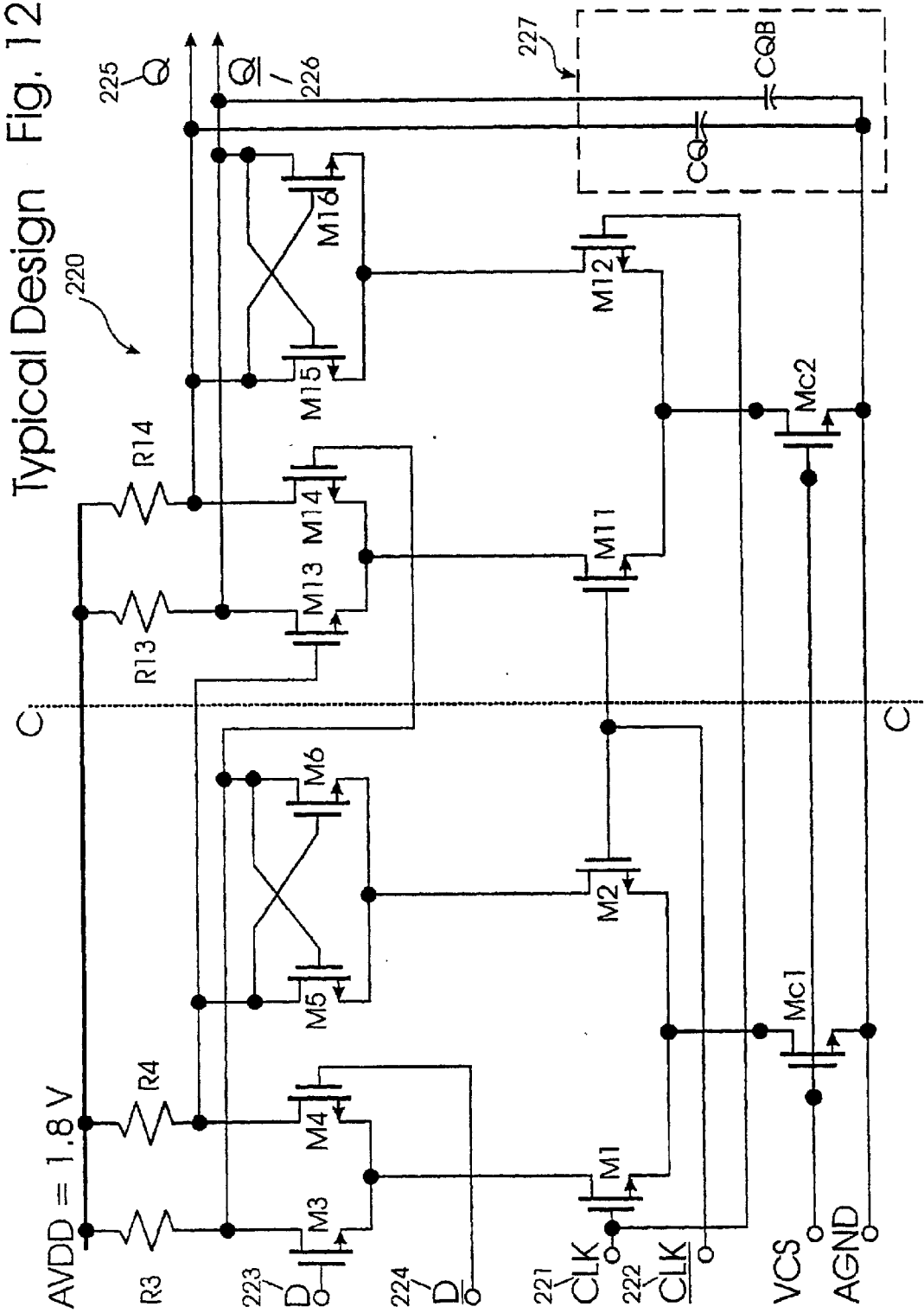
Typical Design Fig. 12

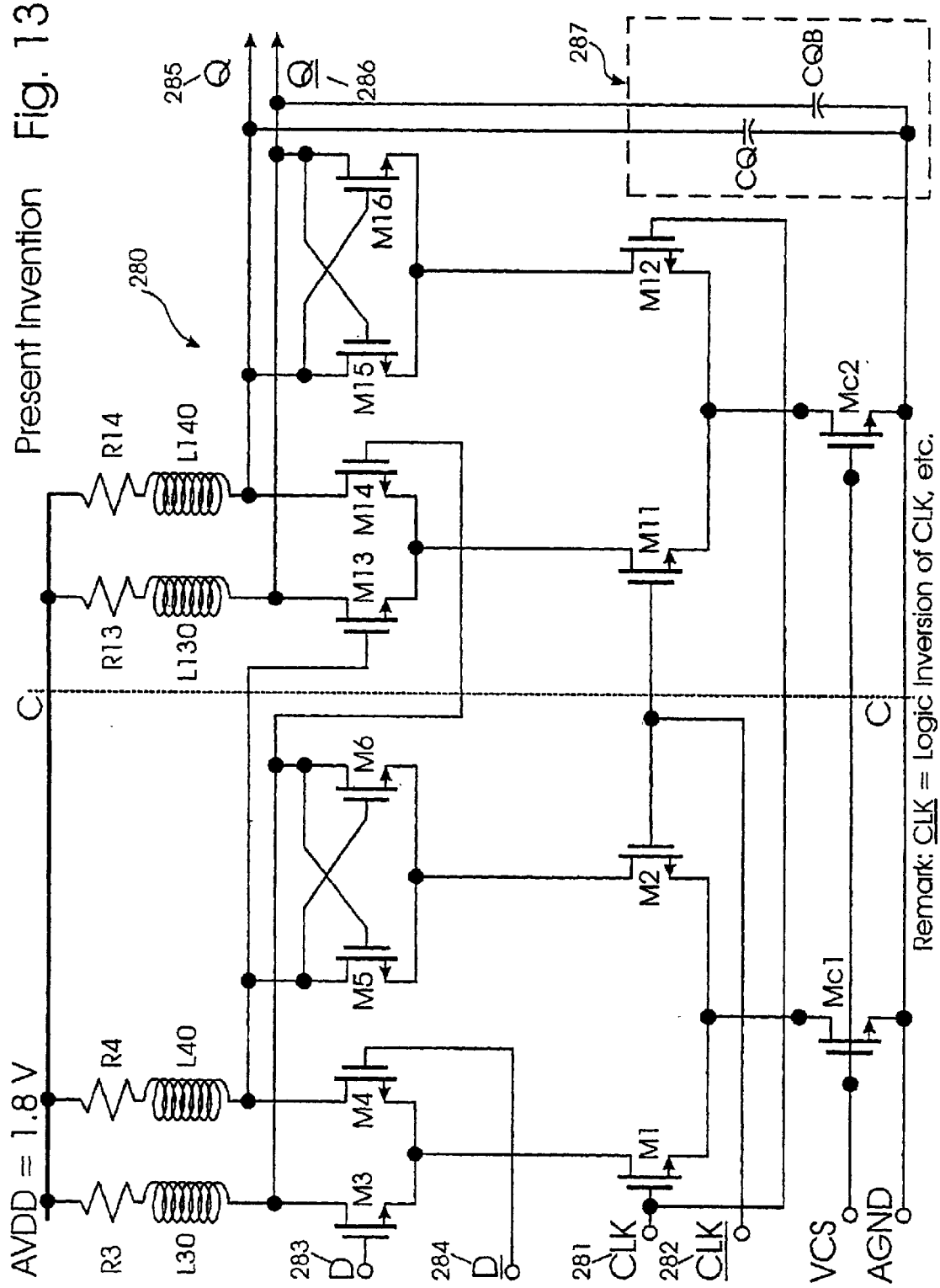
Present Invention Fig. 13

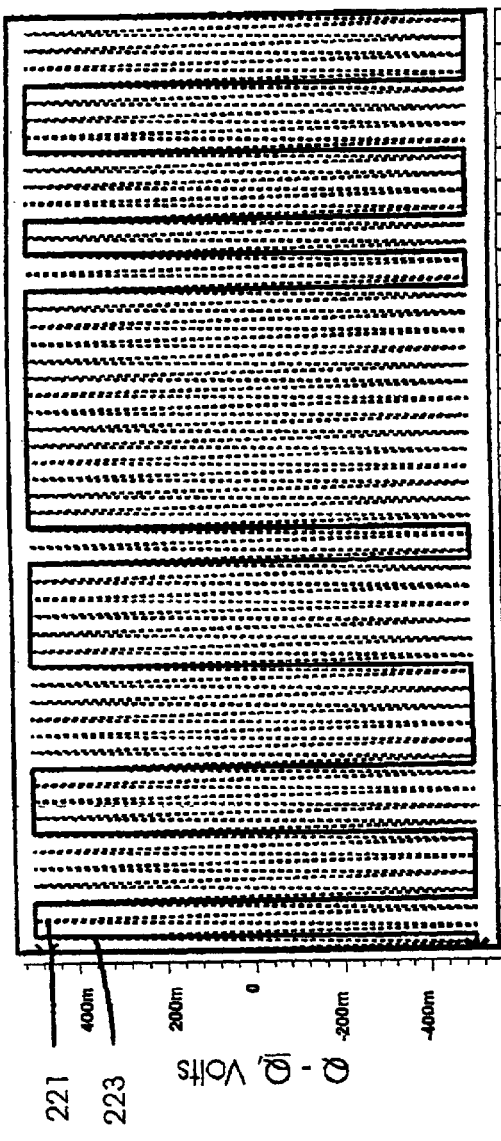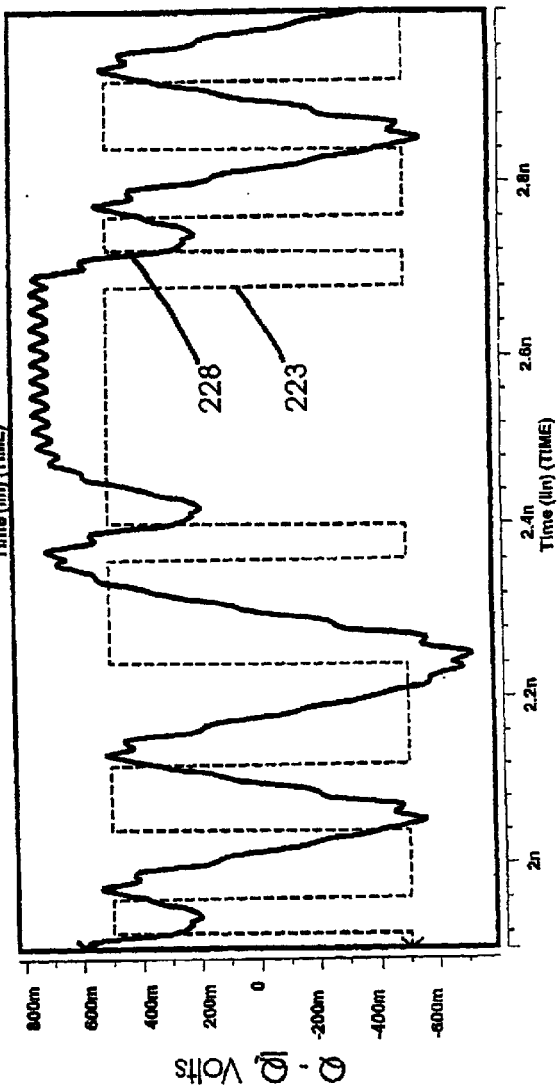

2-LEVEL SERIES-GATED CURRENT MODE LOGIC WITH INDUCTIVE COMPONENTS FOR HIGH-SPEED CIRCUITS

FIELD OF THE INVENTION

The present invention relates generally to the field of data communication. More particularity, the present invention discloses a fundamental building block of Current Mode Logic (CML)-based transistor circuit for an electronic circuit system for optical communication capable of running at an input clock frequency of 50 GHz (Gegahertz, 1 Gegahertz=$10^9$ cycles/sec) when implemented on Silicon with a 0.18 μm CMOS wafer process. Thus, its direct applications include many subsystem functions such as flip-flops, dividers, counters, frequency multipliers, frequency synthesizers, multiplexers, demultiplexers, phase and frequency detectors, Phase Locked Loops (PLL) in an optical switch IC for optical communication. Additional related applications are: Optical communication at 2.48 Gbit/sec (OC48) and 40 Gbit/sec (OC768) data rate, Gigabit Ethernet, 10 Gigabit Ethernet, Blue Tooth technology (2.4 GHz) and wireless LAN (5.2 GHz). At such a high data rate, the hardware infrastructure for a multimedia information super highway is also enabled.

BACKGROUND OF THE INVENTION

Optical Fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec.

To keep up with the data rate of optical data communications, the associated signal processing IC (Integrated Circuit) need to operate in the multiple GHz to hundreds of GHz range of clock frequency. Maskai et al published fully differential CMOS folded source-coupled gate circuit topologies using a series-gating technique of up to three levels of complexity (Synthesis Techniques for CMOS Folded Source-Coupled Logic Circuits—Sailesh R. Maskai, Sayfe Kiaei, and David J. Allstot, IEEE Journal of Solid-state Circuits, VOL. 27, NO. 8, August 1992). Sharaf et al published a circuit topology of series-gated CML-based Bipolar circuits of up to two levels of complexity wherein the top level section includes a resistive load (Analysis and Optimization of Series-Gated CML and ECL High-Speed Bipolar Circuits—Khaled M. Sharaf and Mohamed I. Elmasry, IEEE Journal on Solid-State Circuits, Vol. 31, No. 2, February 1996). Razavi et al published a circuit topology of one level CML-based CMOS circuits for optical communications wherein the load section includes a series connection of a resistor and a resonance inductor (A 10 Gb/s CMOS Clock and Data Recovery Circuit with Frequency Detection—Jafar Savoj, Behzad Razavi, 2001 IEEE International Solid-State circuits Conference, 2001). To further improve the performance parameters of such high speed circuits, the inclusion of a more general type of inductive components properly designed for RF (Radio Frequency) operation is a possibility.

SUMMARY

The present invention is directed to a fundamental building block of 2-level series-gated CML-based transistor circuit incorporating a more general type of inductive components that include transformers and individual inductors for an electronic circuit system for optical communication. While the effect of resonance would naturally take place between an added inductive component and its equivalent node capacitance, $C_{eq}$, the inductance value of the added inductive component is further adjusted to achieve an optimized performance in the presence of any nonlinear behavior of the circuit and, especially, additional feedback effect in cases where the inductive components are coupled with each other to form a transformer.

The first objective of this invention is for the 2-level series-gated CML-based transistor circuit of the present invention to achieve a higher operating frequency.

The second objective of this invention is for the 2-level series-gated CML-based transistor circuit of the present invention to achieve a higher load-driving capacity while under a significant capacitive loading at its output.

Other objectives, together with the foregoing are attained in the exercise of the invention in the following description and resulting in the embodiment illustrated in the accompanying drawings.

BRIEF DESCRIPTION OF DRAWINGS

The current invention will be better understood and the nature of the objectives set forth above will become apparent when consideration is given to the following detailed description of the preferred embodiments. For clarity of explanation, the detailed description further makes reference to the attached drawings herein:

FIG. 1 and FIG. 2 show a typical design of a divide-by-2 counter circuit with current mode switching and its associated logic functional block representation;

FIG. 3 shows the circuit design of the present invention, with the addition of a number of transformers formed with coupled inductive components, of otherwise the same divide-by-2 counter circuit with current mode switching;

FIG. 4 details the circuit design parameters of the present invention of the same divide-by-2 counter circuit with the illustration of various inherent capacitive components involved in the quantitative selection of the inductive values for the transformers;

FIG. 12 shows a typical design of a Master Slave D-type Flip Flop (MS-DFF) circuit with current mode switching;

FIG. 13 shows the circuit design of the present invention, with the addition of a number of inductors, of otherwise the same MS-DFF circuit with current mode switching;

FIG. 14A-1 and FIG. 14A-2 depict the time-domain input waveforms, including a pseudo random input data stream, and a corresponding output signal waveform from an MS-DFF circuit of a typical design; and FIG. 14B-1 and FIG. 14B-2 depict the time-domain input waveforms, including a pseudo random input data stream, and a corresponding output signal waveform from an MS-DFF circuit of the present invention.

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figures 1, 14B:
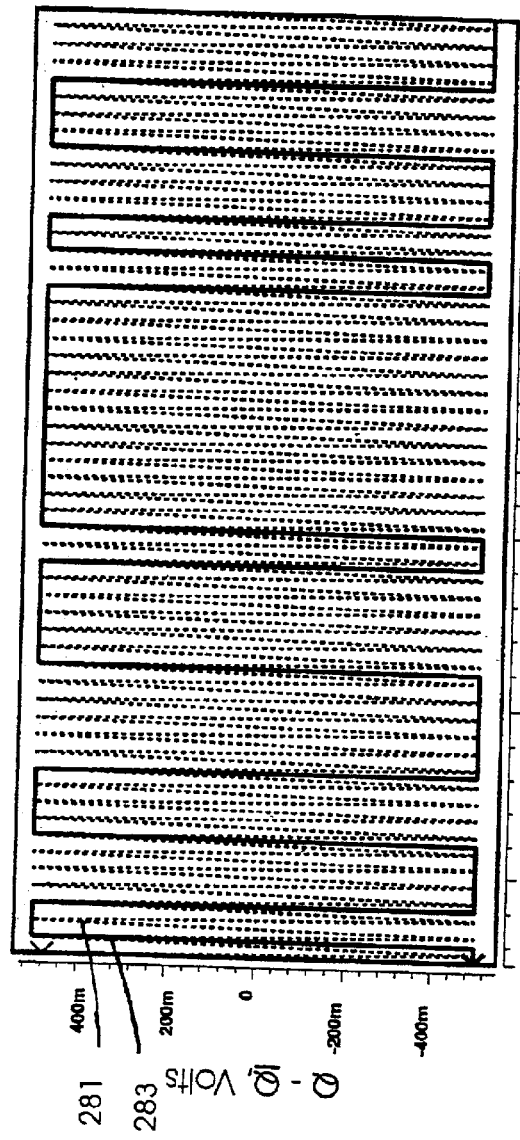
Figures 2, 14B:
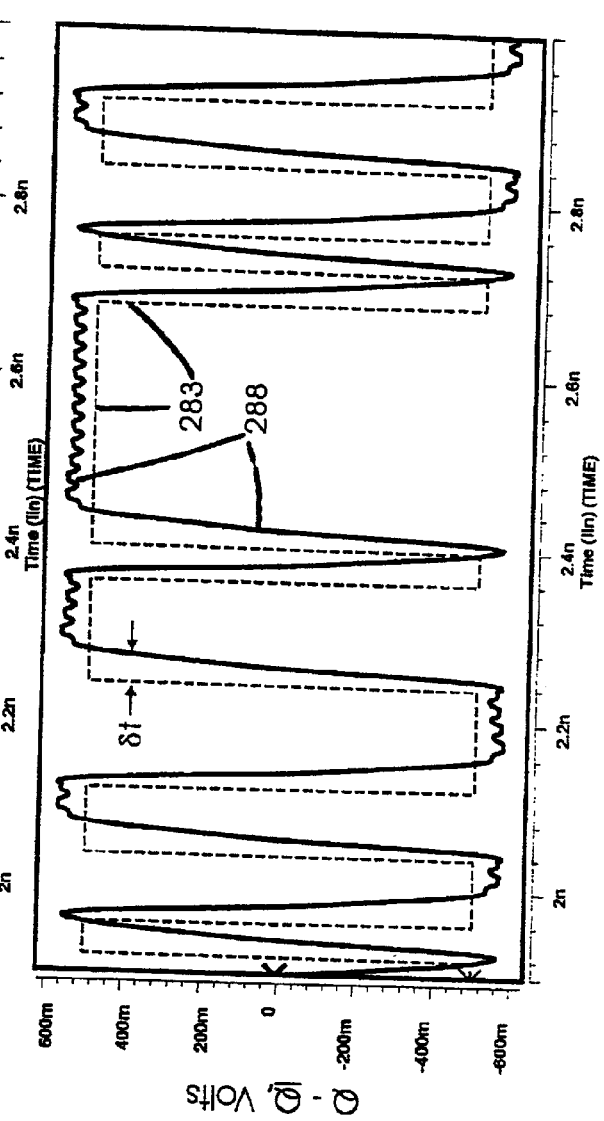

FIG. 1 shows a typical design divide-by-2 counter circuit 20 with current mode switching. In this exemplary case the power supply voltage AVDD is shown to be 1.8 Volt above an analog ground AGND although other values of AVDD could be used just as well, for example 2.5 Volt. Through the typical design divide-by-2 counter circuit 20, the frequency of a differential signal between a CLK 21 and a CLK 22 is divided in half into the differential signal between output signals Q 23 and Q 24. The various active NMOS transistors are designated as Mc1, Mc2, M1, M2, . . . , and M16. The four load resistors are designated R3, R4, R13 and R14. Except for a typical output loading 25 comprising capacitances CQ and CQB, the topology of the typical design divide-by-2 counter 20 can be seen to consist of two identical building blocks divided along a center line C—C and the circuit topology of these building blocks will be presently described. The building block to the left of the center line C—C comprises a number of successive levels of connected circuit structures in a direction from the analog ground AGND to the power supply AVDD. Thus, the first is a bias level circuit structure comprising a constant current source NMOS transistor Mc1 with its source connected to AGND and its gate connected to an externally supplied control voltage VCS that sets up a current level for the current mode switching. Next, a first level circuit structure comprising two source coupled NMOS transistors M1 and M2 with their source terminals connected to the drain of transistor Mc1 and their respective gates connected to the pair of externally supplied differential clock signals CLK 21 and CLK 22. Next, a second level circuit structure comprising the following two sub-circuit structures connected in parallel:

SUB-C1 comprises two source coupled NMOS transistors M3 and M4 with their drains respectively bridged to AVDD with two serial load resistors R3 and R4

SUB-C2 comprises two cross coupled NMOS transistors M5 and M6

The building block to the right of the center line C—C is, as mentioned before, the same as the just-described one to the left. To be a practically useful circuit, the output signals Q 23 and Q 24 must be capable of driving an output loading 25 comprising capacitances CQ and CQB and typically they are in the range of 100 to 300 ff (femtofarad, or $10^{-15}$ farad).

Figure 2:
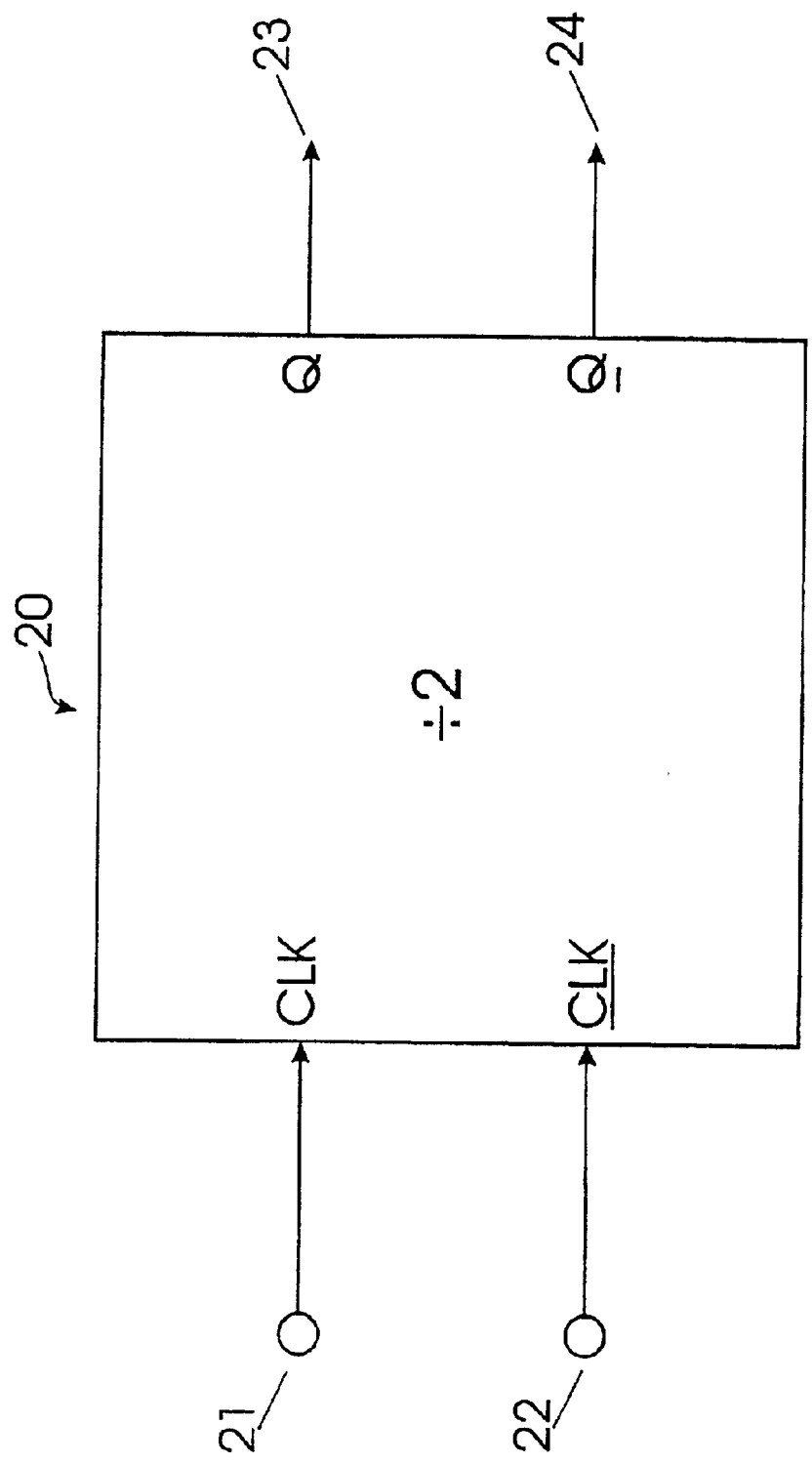

For those skilled in the art, this type of circuitry is manufacturable with a CMOS IC wafer process. If, additionally, the building blocks of the typical design divide-by-2 counter circuit 20 can be further topologically improved and quantitatively designed to provide a high quality signal output at a high CLK frequency, such as a 40 GHz for OC-768 communication, then the improved building blocks can be used as one of the fundamental building blocks for an electronic circuit system for optical communication. For convenience, the associated logic functional block representation is shown in FIG. 2.

FIG. 3 shows the improved design of a present invention divide-by-2 counter circuit 80 also with current mode switching. Notice that the design with the present invention is almost identical to the typical design of FIG. 1 except that, within each building block and in series with each of the four load resistors R3, R4, R13 and R14, an internal inductive component is added. These internal inductive components are, respectively, L3, L4, L13 and L14. Additionally both inductive component pairs (L3,L4) and (L13,L14) within each building block are magnetically coupled within themselves to form two transformers T34 and T134 each with a coupling coefficient of K and a differential polarity of coupling as indicated with two large black dots next to the respective coils. The functions of these transformers will be presently explained. Like before, the supply voltage AVDD is shown to be 1.8 Volt above an analog ground AGND. Similarly, through the present invention divide-by-2 counter circuit 80, the frequency of a differential signal between a CLK 81 and a CLK 82 is divided in half into the differential signal between output signals Q 83 and Q 84. The various active NMOS transistors are still designated as Mc1, Mc2, M1, M2, . . . , and M16. Likewise, the four load resistors are designated R3, R4, R13 and R14. Except for a typical output loading 85 comprising capacitances CQ and CQB, the topology of the present invention divide-by-2 counter 20 can be seen to also consist of two identical building blocks divided along a center line C—C. For the building block to the left of the center line C—C, the added transformer T34 provides two beneficial effects. First, each of the inductive coils L3 and L4 has a natural tendency to resonate, at its lower node, with an associated equivalent node capacitance. Secondly, the differential magnetic coupling, with the coupling coefficient K, between the inductive components L3 and L4 of the transformer T34 acts as a positive feedback during an electrical transition where a bias current is switched between transistors M3 and M4. As a result, the resulting present invention divide-by-2 counter 80 can achieve a higher operating frequency while providing a higher load-driving capacity and these advantages will be presently illustrated with numerous examples. To those skilled in the art, for the building block to the right of the center line C—C, the added transformer T134 will provide similar beneficial effects. For simplicity of illustration, all examples of transformers will be presented with a coupling coefficient of K=0.5.

To illustrate a preferred method of determining the proper values of the inductive coils L3 L3, L4, L13 and L14, FIG. 4 shows the present invention divide-by-2 counter circuit 80 with detailed illustration of various inherent capacitive components involved in the quantitative determination of the inductive values. More specifically, all the direct and parasitic capacitive components internal to the right-hand building block of the present invention divide-by-2 counter circuit 80 and being electrically interacting with the lower node, ND1, of inductive coil L14 are illustrated. For those skilled in the art, the direct and parasitic capacitive components are seen to be:

a gate to drain capacitance C4GD of transistor M4;
a gate to source capacitance C4GS of transistor M4;
a gate to bulk capacitance C4GB of transistor M4;
a drain to source capacitance C14DS of transistor M14;
a drain to gate capacitance C14DG of transistor M14;
a drain to bulk capacitance C14DB of transistor M14;
a drain to source capacitance C15DS of transistor M15;
a drain to gate capacitance C15DG of transistor M15;
a drain to bulk capacitance C15DB of transistor M15;
a gate to drain capacitance C16GD of transistor M16;
a gate to source capacitance C16GS of transistor M16; and
a gate to bulk capacitance C16GB of transistor M16.

As the estimation of the value of the above direct and parasitic capacitive components is known to the art, they are not shown here for simplicity. For a concise presentation of the present invention, the following is defined for the sum total of all the direct and parasitic capacitive components internal to the right-hand building block of the present invention divide-by-2 counter circuit 80 and being electrically interacting with the lower node, ND1, of inductive coil L14:

equivalent node capacitance $C_{eq}$=C4GD+C4GS+C4GB+C14DS+ C14DG+C14DB+C15DS+C15DG+C15DB+C16GD+C16GS+ C16GB  (1)

Next, a starting value of inductance, $L_s$, is estimated for L14 such that the inductance $L_s$ would resonate with the equivalent node capacitance $C_{eq}$ at a frequency $f_{res}$ that is equal to the desired output signal frequency of the present invention divide-by-2 counter circuit 80. For those skilled in the art, this means:

$$f_{res}=1/[2\pi \times (L_s \times C_{eq})^{1/2}] \quad (2)$$

As a first example:

CLK frequency=12.5 GHz;
$f_{res}$=output signal frequency=CLK frequency/2=6.25 GHz; and
$C_{eq}$=78.5 ff
yields an $L_s$=8.2 nh (nanohenry, $10^{-9}$ henry).

However, in reality, the typical output loading capacitances CQ and CQB are quite significant as noted above. Additionally, the above model of equation (2) for an L-C resonant circuit assumes a linear model of constant $C_{eq}$ that is not quite true in the present invention divide-by-2 counter circuit 80 wherein all the transistors are switched between a highly conductive state and a cut-off state. Even more importantly, the differential magnetic coupling, with a coupling coefficient K of 0.5, between the inductive components L13 and L14 of the transformer T134 introduces positive feedback effect during any electrical transition where a bias current is switched between transistors M13 and M14. Therefore, an optimal value for the internal inductive coil L14 needs to be derived from the starting value of inductance $L_s$ with the present invention divide-by-2 counter circuit 80 driving an expected level of output loading capacitances CQ and CQB. Specifically, the present invention proposes to systematically adjust the value of the internal inductive coil L14 from the above $L_s$ for a final value $L_f$ such that, while maintaining the basic functionality of the present invention divide-by-2 counter circuit 80 with a sinusoidal differential input signal CLK-CLK and an expected output loading capacitances CQ and CQB, the waveform distortion of the associated differential output signal Q-Q gets minimized when L14=$L_f$. Furthermore, of course, the same method for the determination of L14 should be simultaneously applied to the determination of all the other internal loading inductances L3, L4 and L13. It is also important to remark that, while the method of determination of the internal loading inductors is stated as based upon a differential input signal CLK-CLK that is a sinusoidal waveform, at such high levels of CLK frequency for optical communication, a trapezoidal waveform or other similar waveforms of around 50% duty cycle are found to produce approximately the same results for all the internal inductive coils L3, L4, L13 and L14.

A first example of application of the present invention at a CLK frequency of 12.5 GHz is illustrated in TABLE 1 below:

TABLE 1

| | CLK frequency = 12.5 GHz, CQ = CQB = 0 ff | | | | | |
|---|---|---|---|---|---|---|
| fres, GHz | Ceq, ff | Ls, nh | L3, nh | L4, nh | L13, nh | L14, nh |
| 6.25 | 78.5 | 8.2 | 1.8 | 1.8 | 1.8 | 1.8 |

Figure 5A:
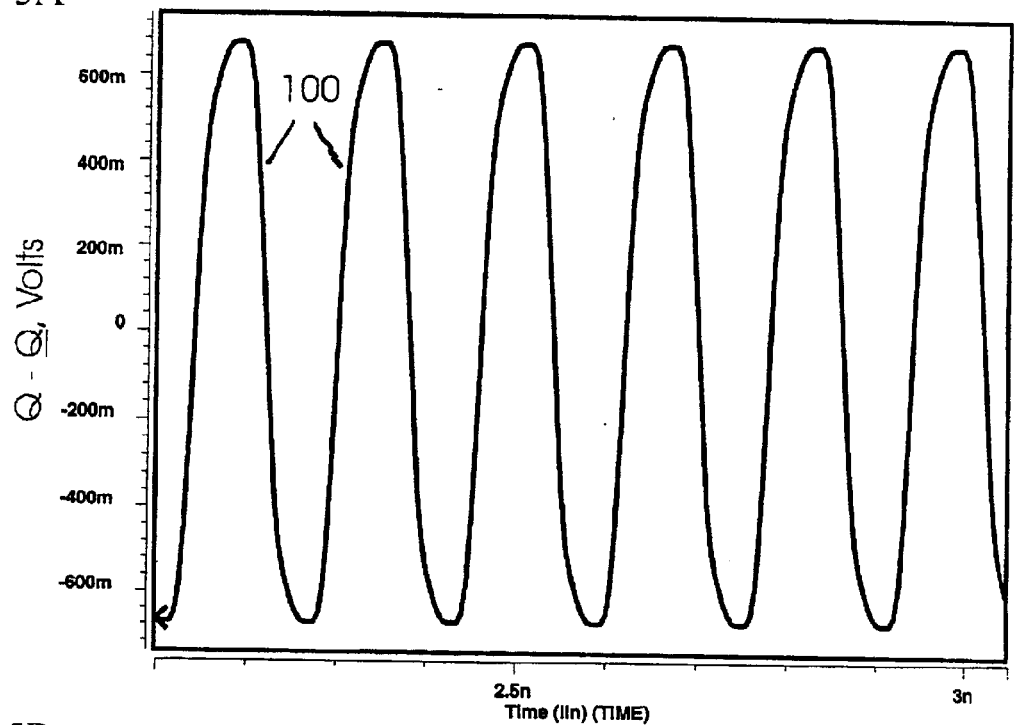
FIG. 5A and FIG. 5B compare the time-domain waveforms of the individual differential output signals between a typical design and the present invention of the divide-by-2 counter circuit designed for a first clock frequency wherein the output terminals are subject to no external capacitive loading.
Figure 5B:
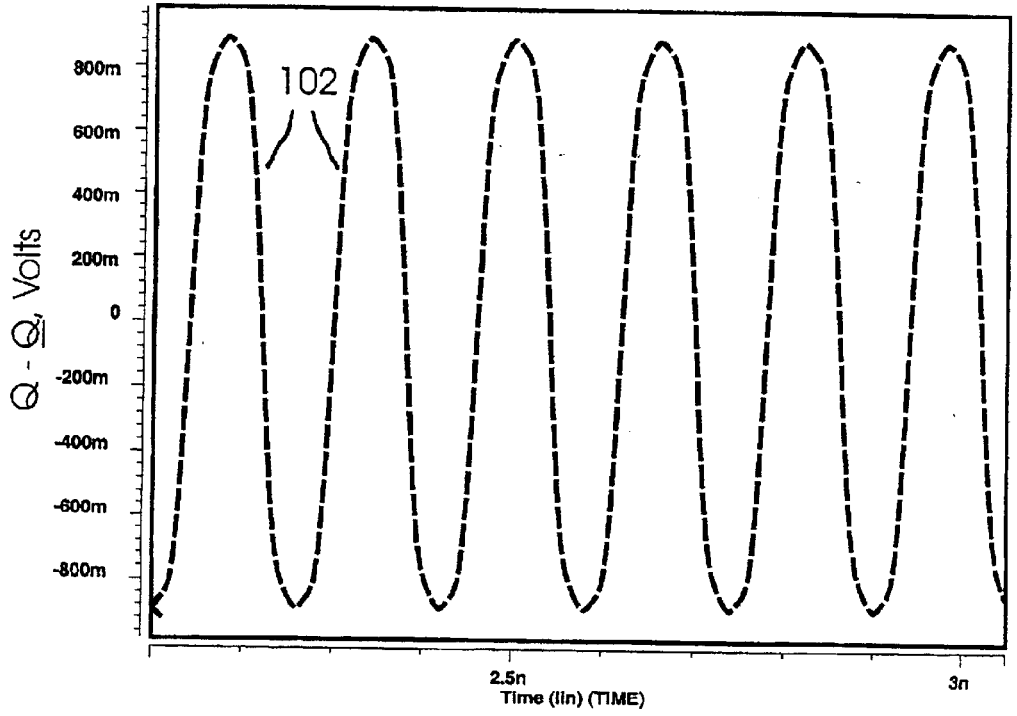
Figure 6A:
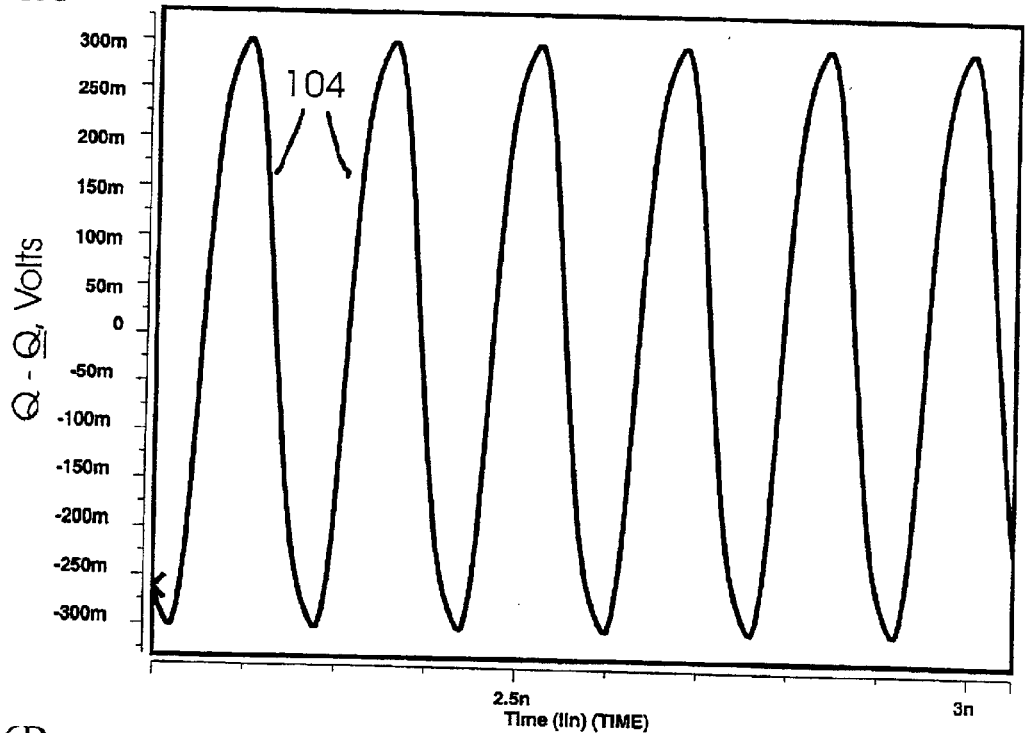
FIG. 6A and FIG. 6B compare the time-domain waveforms of the individual differential output signals between a typical design and the present invention of the divide-by-2 counter circuit designed for the same first clock frequency wherein the output terminals are subject to a first low level of external capacitive loading.
Figure 6B:
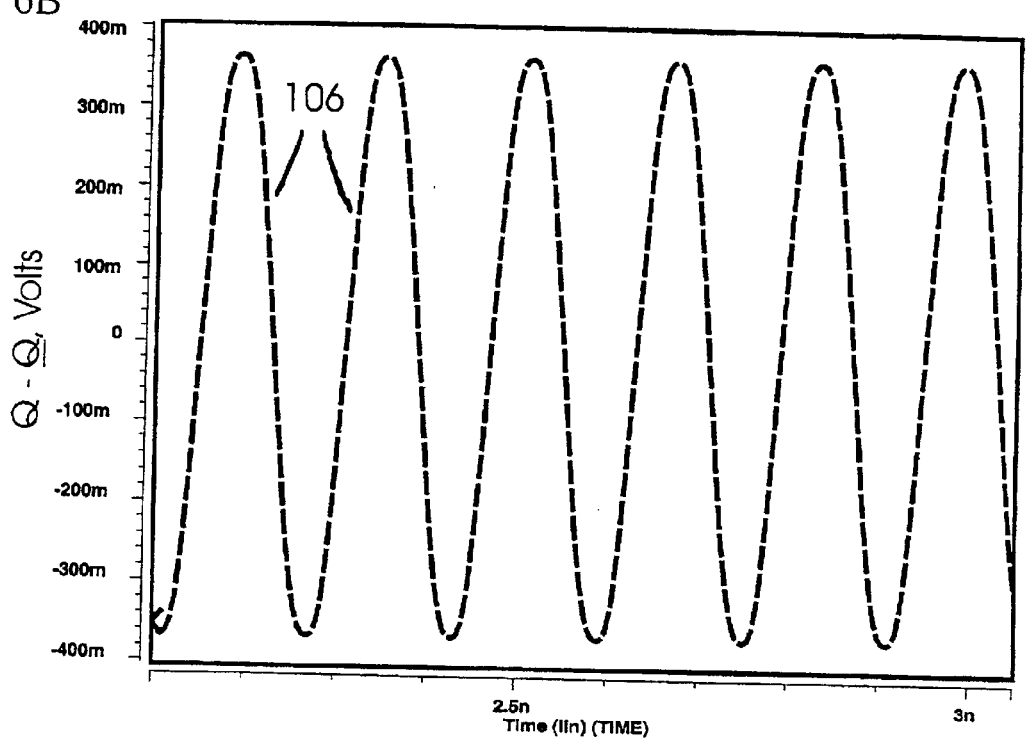
Figure 7A:
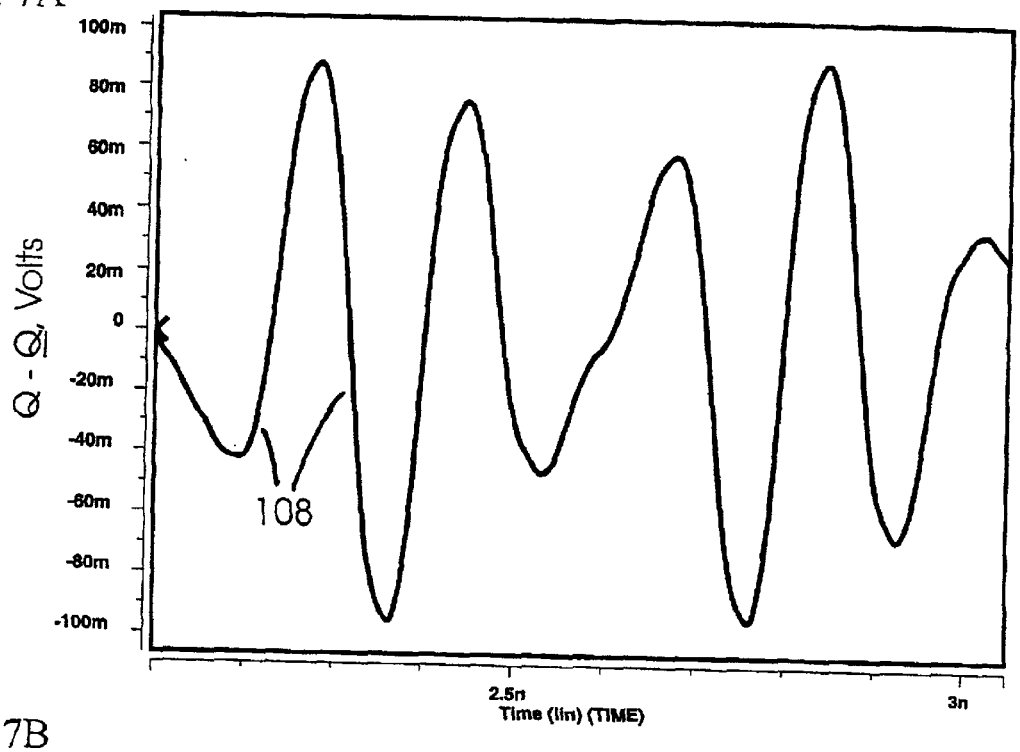
FIG. 7A and FIG. 7B compare the time-domain waveforms of the individual differential output signals between a typical design and the present invention of the divide-by-2 counter circuit designed for the same first clock frequency wherein the output terminals are subject to a second intermediate level of external capacitive loading.
Figure 7B:
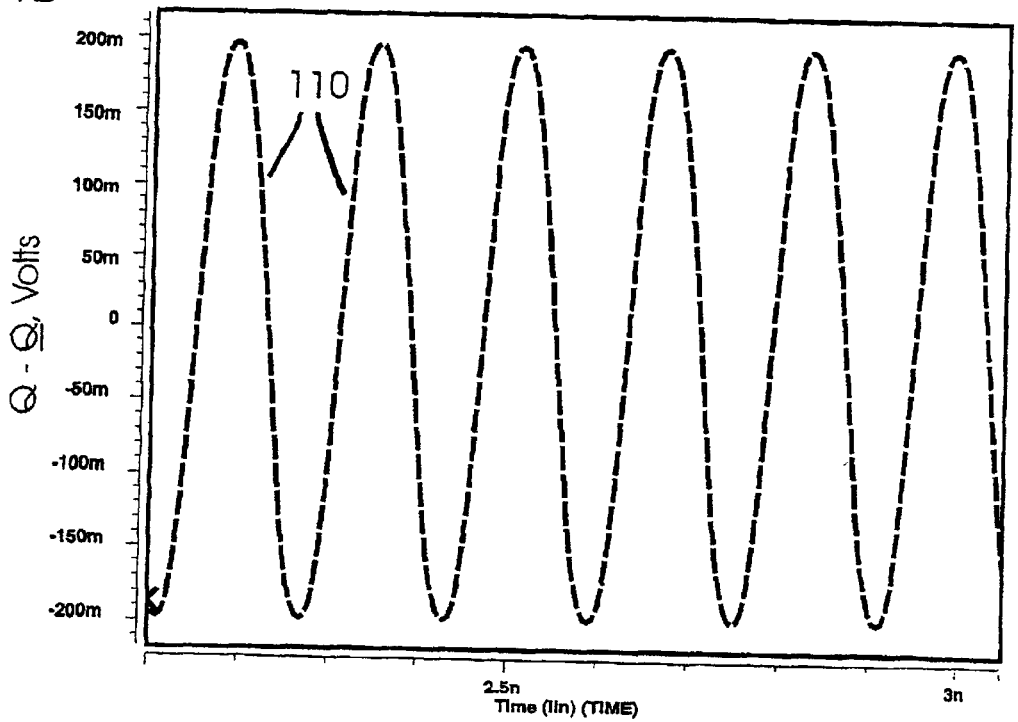

The comparison of the corresponding time-domain waveforms of the differential output signals Q-Q between a typical design and the present invention divide-by-2 counter at various operating frequencies and under various levels of loading capacitances CQ and CQB are illustrated in FIG. 5 to FIG. 7. In all cases the divide-by-2 counter is driven by a sinusoidal differential input signal CLK–CLK although, at such high levels of CLK frequency for optical communication, a trapezoidal waveform or other similar waveforms of around 50% duty cycle are found to produce approximately the same results of comparison. With no loading capacitance (CQ=CQB=0), the differential output signal from a typical design 100 in FIG. 5A is functional and is only a little lower in amplitude than the functional differential output signal from the present invention 102 in FIG. 5B. Under a first intermediate level of external capacitive loading of CQ=CQB=150 ff, the differential output signal from a typical design 104 in FIG. 6A is functional but is reduced to about 81% in amplitude and with a visible waveform distortion compared to the functional differential output signal from the present invention 106 in FIG. 6B. Under a second high level of external capacitive loading of CQ=CQB=300 ff, the differential output signal from a typical design 108 in FIG. 7A has completely failed with an accompanying high degree of waveform distortion while the differential output signal from the present invention 110 in FIG. 7B continues to function properly albeit with reduced amplitude from before. Therefore, the present invention divide-by-2 counter circuit 80, compared to a typical divide-by-2 counter 20, is capable of driving a significantly higher level of external capacitive load at a high input CLK frequency while providing a high output signal fidelity for optical data communication.

Figure 8A:
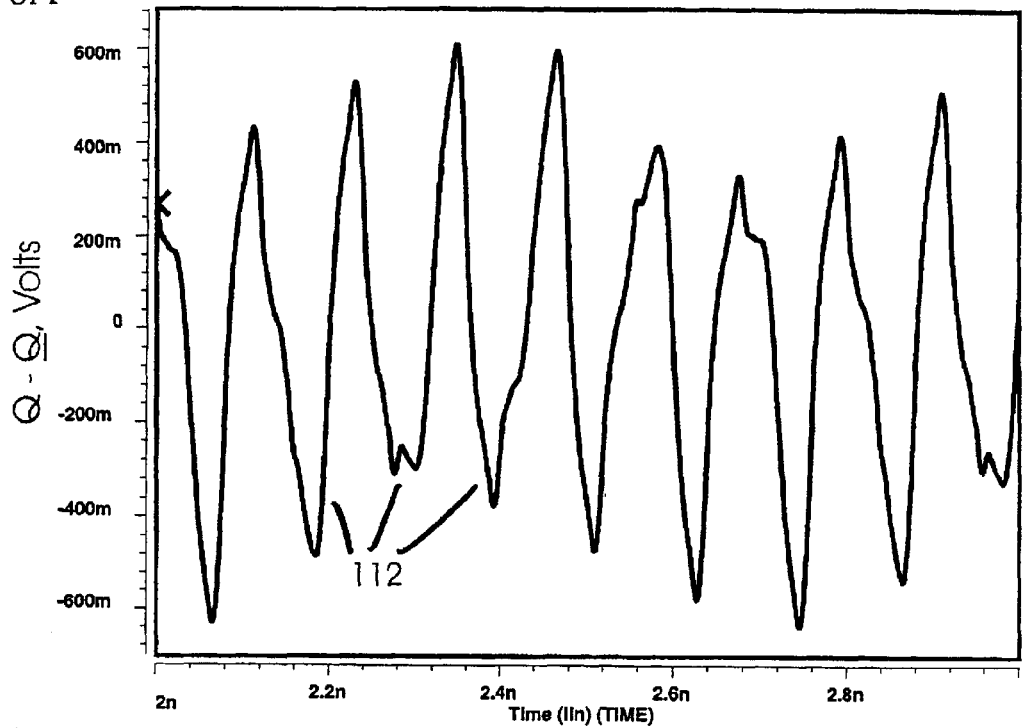
FIG. 8A and FIG. 8B compare the time-domain waveforms of the individual differential output signals between a typical design and the present invention of the divide-by-2 counter circuit designed for a second higher clock frequency wherein the output terminals are subject to no external capacitive loading.
Figure 8B:
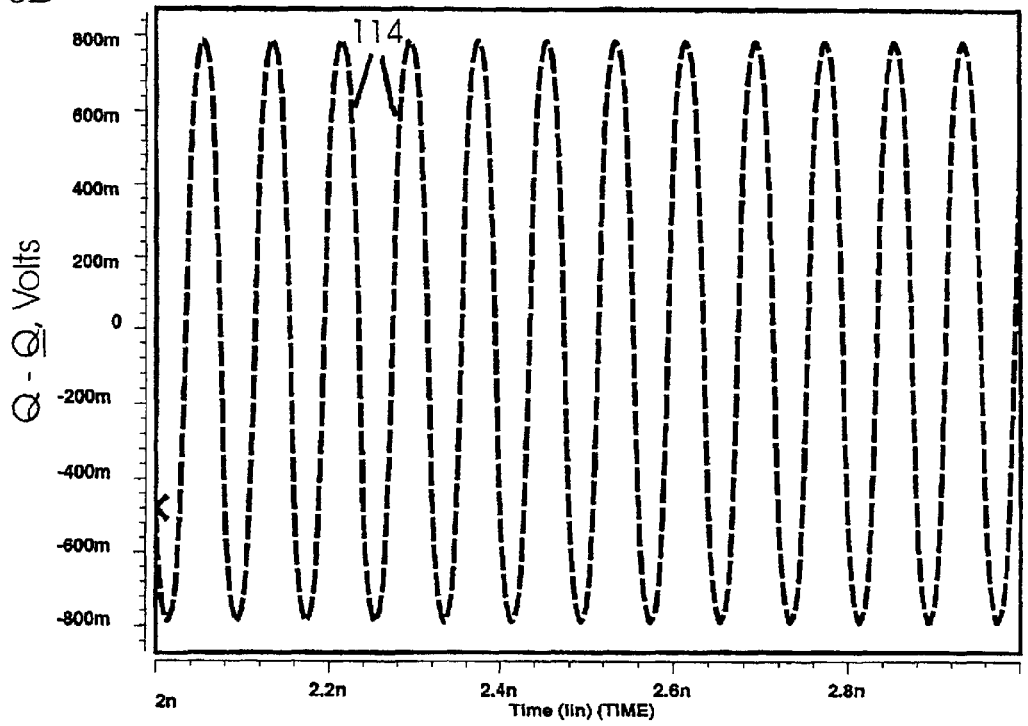
Figure 9A:
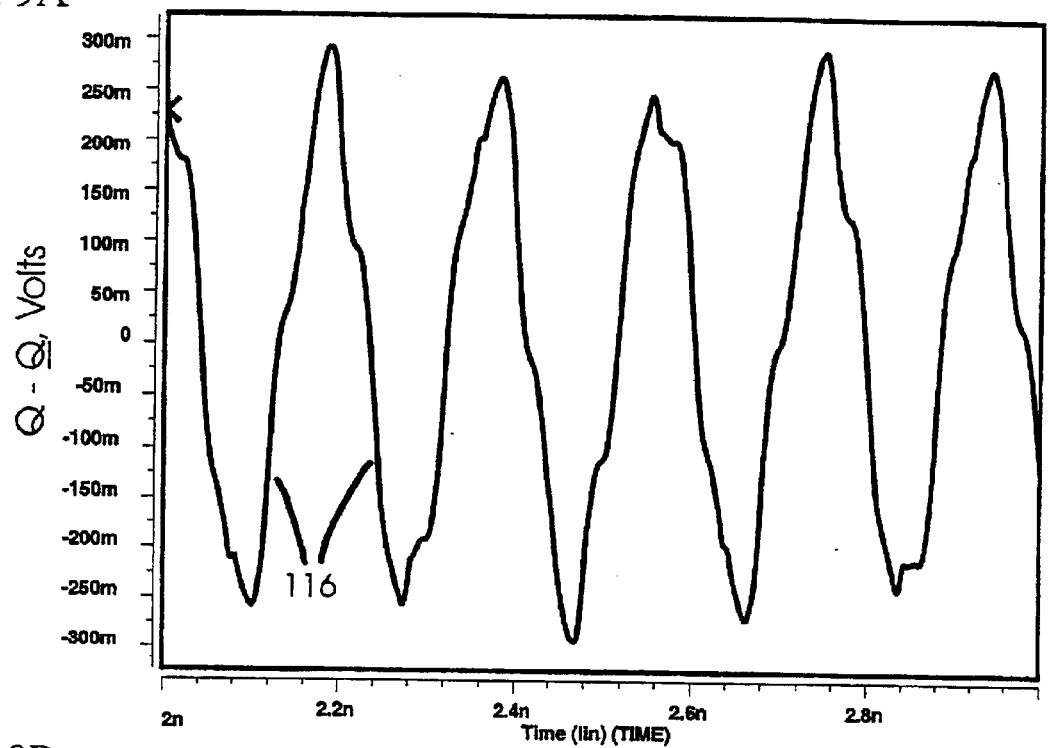
FIG. 9A and FIG. 9B compare the time-domain waveforms of the individual differential output signals between a typical design and the present invention of the divide-by-2 counter circuit designed for a second higher clock frequency wherein the output terminals are subject to a first low level of external capacitive loading.
Figure 9B:
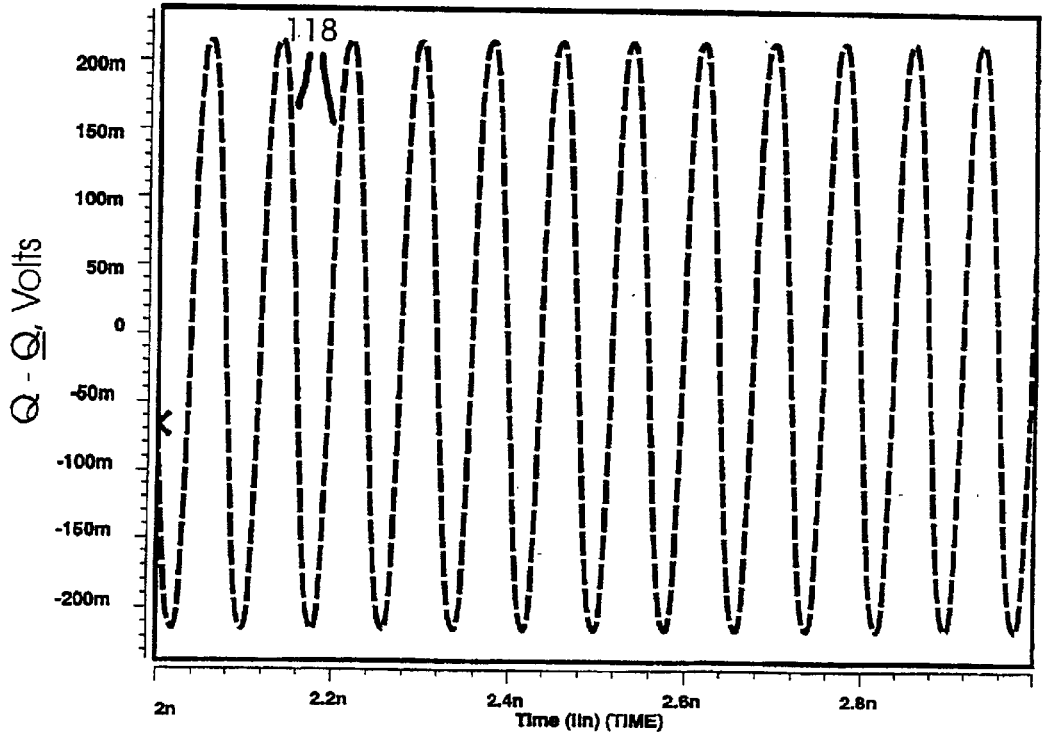

A second example of application of the present invention divide-by-2 counter circuit 80 at a higher CLK frequency of 25 GHz under various levels of loading capacitances CQ and CQB are illustrated in FIG. 8 to FIG. 9. With no loading capacitance (CQ=CQB=0), the differential output signal from a typical design 112 in FIG. 8A has already failed with an accompanying high degree of waveform distortion while the differential output signal from the present invention 114 in FIG. 8B continues to function properly. Under a first intermediate level of external capacitive loading of CQ=CQB=150 ff, the differential output signal from a typical design 116 in FIG. 9A continues to fail with an accompanying high degree of waveform distortion while the differential output signal from the present invention 118 in FIG. 9B remains functional with minimal waveform distortion albeit exhibiting a significantly reduced amplitude from that of FIG. 8B.

Figure 10A:
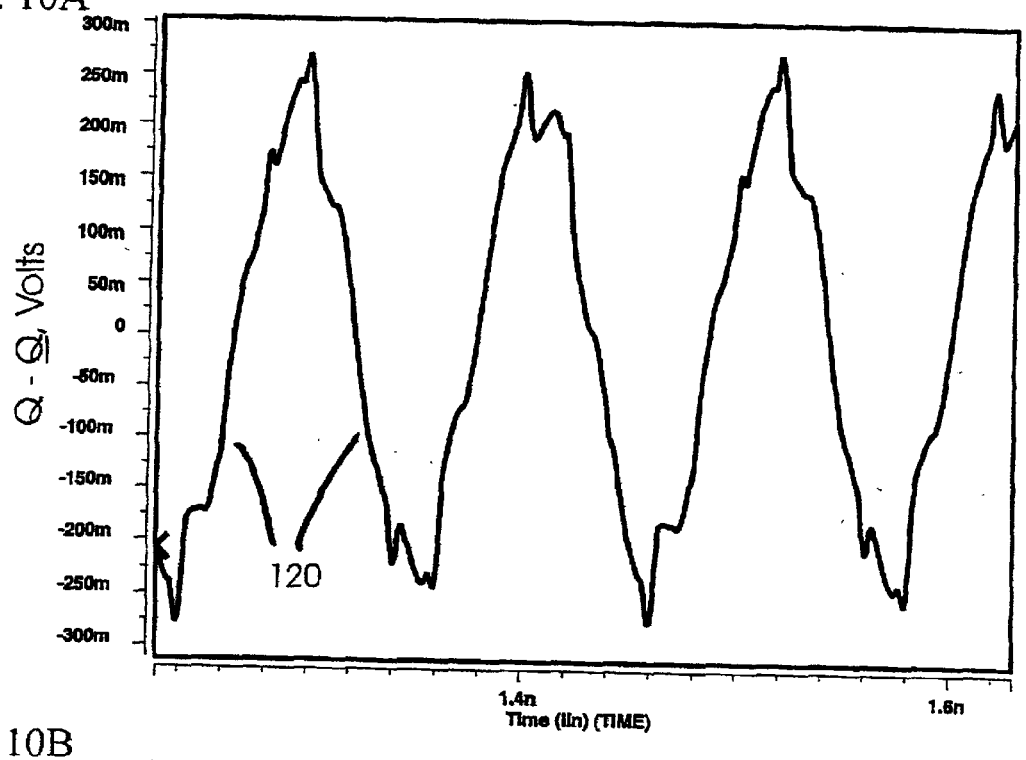
FIG. 10A and FIG. 10B compare the time-domain waveforms of the individual differential output signals between a typical design and the present invention of the divide-by-2 counter circuit designed for a third even higher clock frequency wherein the output terminals are subject to no external capacitive loading.
Figure 10B:
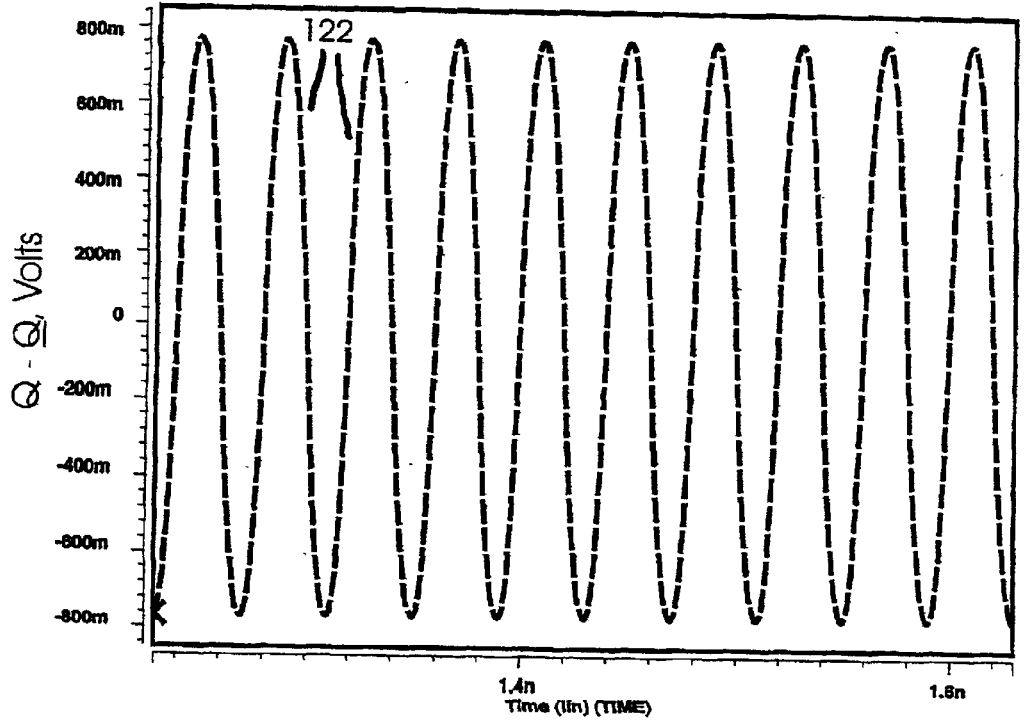
Figure 11A:
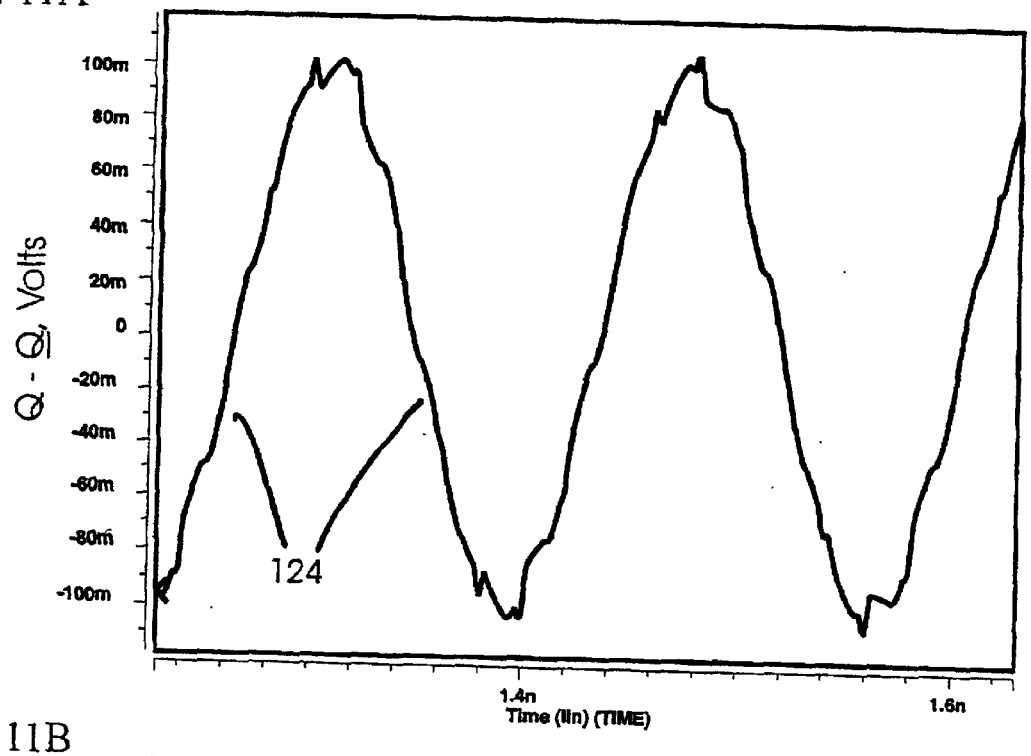
FIG. 11A and FIG. 11B compare the time-domain waveforms of the individual differential output signals between a typical design and the present invention of the divide-by-2 counter circuit designed for a third even higher clock frequency wherein the output terminals are subject to a first low level of capacitive loading.
Figure 11B:
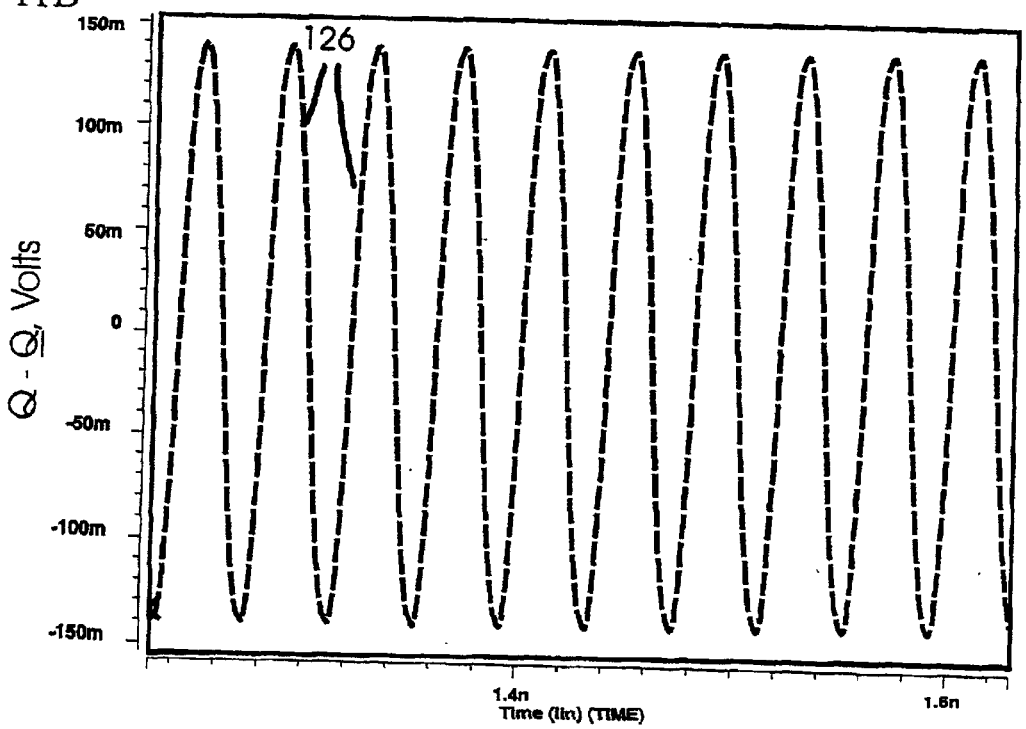

A third example of application of the present invention divide-by-2 counter circuit 80 at an even higher CLK frequency of 50 GHz and under various levels of loading capacitances CQ and CQB are illustrated in FIG. 10 to FIG. 11. With no loading capacitance (CQ=CQB=0), the differential output signal from a typical design 120 in FIG. 10A has already failed with an accompanying high degree of waveform distortion while the differential output signal from the present invention 122 in FIG. 10B continues to function properly. Under a first intermediate level of external capacitive loading of CQ=CQB=150 ff, the differential output signal from a typical design 124 in FIG. 11A continues to fail with an accompanying high degree of waveform distortion while the differential output signal from the present invention 126 in FIG. 11B remains functional with minimal waveform distortion albeit exhibiting a significantly reduced amplitude from that of FIG. 10B. Therefore, the present invention divide-by-2 counter circuit 80, compared to a typical design divide-by-2 counter circuit 20, is also capable of operating at a higher input CLK frequency under significant external loading while providing a high output signal fidelity for optical data communication. By now it should become clear that, while the various examples above using inductive components with an accompanying transformer function are all illustrated, for simplicity of presentation, with a coupling coefficient of K=0.5, the scope of the invention is certainly not limited to the case of K=0.5. For example, the present invention would work just as well with a K=0.8 or a K=0.3, etc.

FIG. 12 shows a typical design Master Slave D-type Flip Flop MS-DFF 220 with current mode switching. The typical design MS-DFF 220, whose logic function is well known in the art, has CLK 221 and CLK 222 as its differential clock input and D 223 and D 224 as its differential data input. The differential output signals are Q 225 and Q 226 with a typical output loading 227 comprising capacitances CQ and CQB. Just like the topology of the typical design divide-by-2 counter presented before, the typical design MS-DFF 220 consists of two identical building blocks divided along a center line C—C. The only differences are the lack of global feedback connections between the two building blocks and, within the left-hand building block, transistors M3 and M4 have their respective gates connected to the differential data input signals D 223 and D 224. In fact, the circuit topology of these building blocks is the same as those of the typical design divide-by-2 counter before. Thus, the improved design of a present invention MS-DFF 280 with current mode switching, as shown in FIG. 13, likewise comprises two building blocks whose circuit topology are similar to those building blocks of the present invention divide-by-2 counter before. However, an intentional variation of the embodiment is made here in that the transformer coupling between inductive coil L30 and inductive coil L40, as well as between inductive coil L130 and inductive coil L140, are eliminated and this is equivalent to setting K=0 in the case of present invention divide-by-2 counter presented before. Otherwise, the present invention MS-DFF 280 has CLK 281 and CLK 282 as its differential clock input and D 283 and D 284 as its differential data input. The differential output signals are Q 285 and Q 286 with a typical output loading 287 comprising capacitances CQ and CQB. Here, each of the added inductive coils L30, L40, L130 and L140 provides a beneficial effect from its natural tendency to resonate, at its lower node, with an associated equivalent node capacitance. As a result, the resulting present invention MS-DFF 280 can also achieve a higher operating frequency while providing a higher load-driving capacity and these advantages will be presently illustrated with an example.

FIG. 14A-1 shows an example of the time-domain input signal waveforms CLK 221 and D 223 as applied to the typical design MS-DFF 220, driving a loading capacitance of 60 ff, of FIG. 12. The corresponding differential output of typical design 228 from typical design MS-DFF 220, superimposed with the input data signal D 223, are shown in FIG. 14A-2. The CLK 221 frequency is 50 GHz. Notice that the input data signal D 223 is a pseudo random bit stream. Clearly, the typical design MS-DFF 220 fails to function here as the differential output of typical design 228 can not follow the pseudo random bit stream of the input data signal D 223. On the other hand, FIG. 14B-1 shows the same time-domain input signal waveforms CLK 281 and D 283 as applied to the present invention MS-DFF 280, driving the same loading capacitance of 60 ff, of FIG. 13. The corresponding differential output of present invention 288 from present invention MS-DFF 280, superimposed with the input data signal D 283, are shown in FIG. 14B-2. The CLK 281 frequency is also 50 GHz. Notice that the input data signal D 283 is the same pseudo random bit stream as before and this pseudo random bit stream is used to adjust and to arrive at a value of 1.2 nh for the inductive coils L30, L40, L130 and L140. Clearly, the present invention MS-DFF 280 functions quite well as the differential output of present invention 288 follows, bit-by-bit, the pseudo random bit stream of the input data signal D 283 with a consistent time delay of δt which can be easily accommodated for at a system level. It is important to remark that, while individual inductive coils are presented here for the present invention MS-DFF 280, the coupling of each pair of inductive coils (for example, inductive coil L13 and inductive coil L14) to form a corresponding transformer still preserves the full functionality of the MS-DFF 280 while, owing to the earlier mentioned additional beneficial effect of positive feedback from the transformer, only requiring a half-sized inductor thus affording corresponding savings of circuit layout size and cost.

As described with a number of exemplary cases of design, a fundamental building block of 2-level series-gated CML-based CMOS circuit which includes a number of internal inductive components for an electronic circuit system is disclosed that is capable of driving a significant level of external capacitive load at a high input clock frequency while providing a high level of output signal fidelity for optical data communication. The invention has been described using exemplary preferred embodiments. However, for those skilled in this field, the preferred embodiments can be easily adapted and modified to suit additional applications without departing from the spirit and scope of this invention. For example, the various CMOS transistors of the building block can be replaced with any species of a generic Field Effect Transistor (FET) such as N-channel Metal Oxide Semiconductor (NMOS) transistor, P-channel Metal Oxide Semiconductor (PMOS) transistor, N-channel Junction FET and P-channel Junction FET. For another example, the various CMOS transistors of the building block can be replaced with any species of a generic Bipolar Transistor (BPT) such as an NPN or a PNP Bipolar transistor. Therefore, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed are the following:

1. An integrated circuit for processing high-speed signals, the integrated circuit comprising:
    a first differential circuit and a second differential circuit, both outputs of the two differential circuits connected in parallel;
    two resistors;
    a transformer including two inductors that are coupled by a coupling factor K, each of the inductors coupled between one of the two resistors and one of two transistors in either one of the two differential circuits, wherein inductance value of either one of the inductors as well as the coupling factor K are adjusted to create resonate frequencies in conjunction with parasitic capacitors of the transistors in the two differential circuits to compensate for parasitic effects caused by the parasitic capacitors so as to increase operating frequency ranges of the integrated circuit.

2. The integrated circuit of claim 1 further comprising a second level differential circuit receiving a clock signal and coupled to the first differential circuit and the second differential circuit.

3. The integrated circuit of claim wherein 1, the coupling factor K is independently adjusted.

4. The integrated circuit of claim 3, wherein a determination of the coupling factor K controls a level of output signal ripple, output signal jitter, unwanted output signal oscillation, signal dynamic range, signal linearity, accuracy of an output signal waveform or output signal phase angle.

5. The integrated circuit of claim 3, wherein the coupling factor K is set to be zero such that the two inductors function like two separate inductors.

6. The integrated circuit of claim 1, wherein the translators are selected from a group consisting of Complementary Metal Oxide Semiconductor (CMOS), N-channel Metal Oxide Semiconductor (NMOS), P-channel Metal Oxide Semiconductor (PMOS), N-channel Junction FET and P-channel Junction FET.

7. The integrated circuit of claim 1, wherein the integrated circuit is designed for flip-flops, dividers, counters, frequency multipliers, frequency synthesizers, multiplexers, demultiplexers, phase locked loops, phase detectors and frequency detectors.

8. A method for processing high-speed signals in an integrated circuit for, the method comprising:
    providing a first differential circuit and a second differential circuit, both outputs of the two differential circuits connected in parallel;
    providing two resistors;
    providing a transformer including two inductors that are coupled by a coupling factor K, each of the inductors coupled between one of the two resistors and one of two transistors in either one of the two differential circuits;
    adjusting inductance value of either one of the inductors as well as the coupling factor K to create resonate frequencies in conjunction with parasitic capacitors of the transistors in the two differential circuits to compensate for parasitic effects caused by the parasitic capacitors so as to increase operating frequency ranges of the integrated circuit.

9. The method of claim 8 further comprising a second level differential circuit receiving a clock signal and coupled to the first differential circuit and the second differential circuit.

10. The method of claim 8, wherein the coupling factor K is independently adjusted.

11. The method of claim 8, wherein a determination of the coupling factor K controls a level of output signal ripple, output signal jitter, unwanted output signal oscillation, signal dynamic range, signal linearity, accuracy of an output signal waveform or output signal phase angle.

12. The method of claim 8, wherein the coupling factor K is set to be zero such that the two inductors function like two separate inductors.

13. The method of claim 8, wherein the transistors are selected from a group consisting of Complementary Metal Oxide Semiconductor (CMOS), N-channel Metal Oxide Semiconductor (NMOS), P-channel Metal Oxide Semiconductor (PMOS), N-channel Junction FET and P-channel Junction FET.

14. The method of claim 8, wherein the integrated circuit is designed for flip-flops, dividers, counters, frequency multipliers, frequency synthesizers, multiplexers, demultiplexers, phase locked loops, phase detectors and frequency detectors.

* * * * *